United States Patent
Pan et al.

(10) Patent No.: US 6,723,643 B1
(45) Date of Patent: Apr. 20, 2004

(54) METHOD FOR CHEMICAL MECHANICAL POLISHING OF THIN FILMS USING END-POINT INDICATOR STRUCTURES

(75) Inventors: Wei Pan, Vancouver, WA (US); David R. Evans, Beaverton, OR (US); Allen W. Burmaster, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/391,435

(22) Filed: Mar. 17, 2003

(51) Int. Cl.$^7$ .......................... H01L 21/00; H01L 21/31
(52) U.S. Cl. .......................... 438/689; 438/3; 438/759
(58) Field of Search .......................... 438/3, 238, 385, 438/631, 686, 689, 692, 759

(56) References Cited

U.S. PATENT DOCUMENTS 6,204,139 B1   3/2001   Liu et al.

OTHER PUBLICATIONS

Liu et al., *Electric–pulse–induced reversible resistance change effect in magnetoresistive films*, Applied Physics Letters, vol. 76, No. 19; May 8, 2000, pp 2749–2751.

Liu et al., *A new concept for non–volatile memory: the electric–pulse induced resistive change effect in Colossal Magnetoresistive thin films*, JPL Publication 01–15; Non–Volatile Memory Technology Symposium 2001; Nov., 2001, pp 18–24.

*Primary Examiner*—Evan Pert
*Assistant Examiner*—Monica D. Harrison
(74) *Attorney, Agent, or Firm*—David C. Ripma; Matthew D. Rabdau

(57) ABSTRACT

A method of CMP thin films during fabrication of IC devices includes preparing a substrate, including building IC component structures on the substrate; depositing a bottom electrode on the substrate; depositing a first CMP layer having a first known CMP selectivity on the substrate; patterning the first CMP layer to form a pattern having a lower margin; forming indicator structures on the first CMP layer in the pattern; depositing a second CMP layer having a second known CMP selectivity relative to that of the first CMP layer, including depositing portions of the second CMP layer in the pattern of the first CMP layer; CMP the structure so that the indicator structures are removed and any portion of the first CMP layer and second CMP layer are removed to a level corresponding to the lower margin; and completing the IC structure.

12 Claims, 4 Drawing Sheets

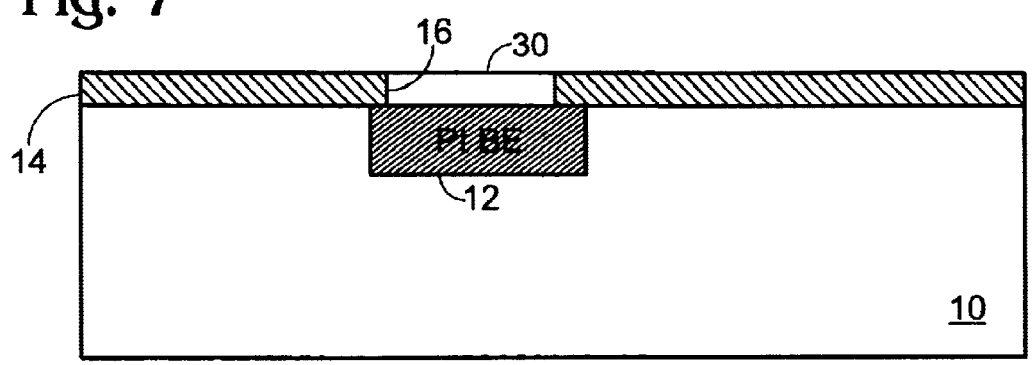
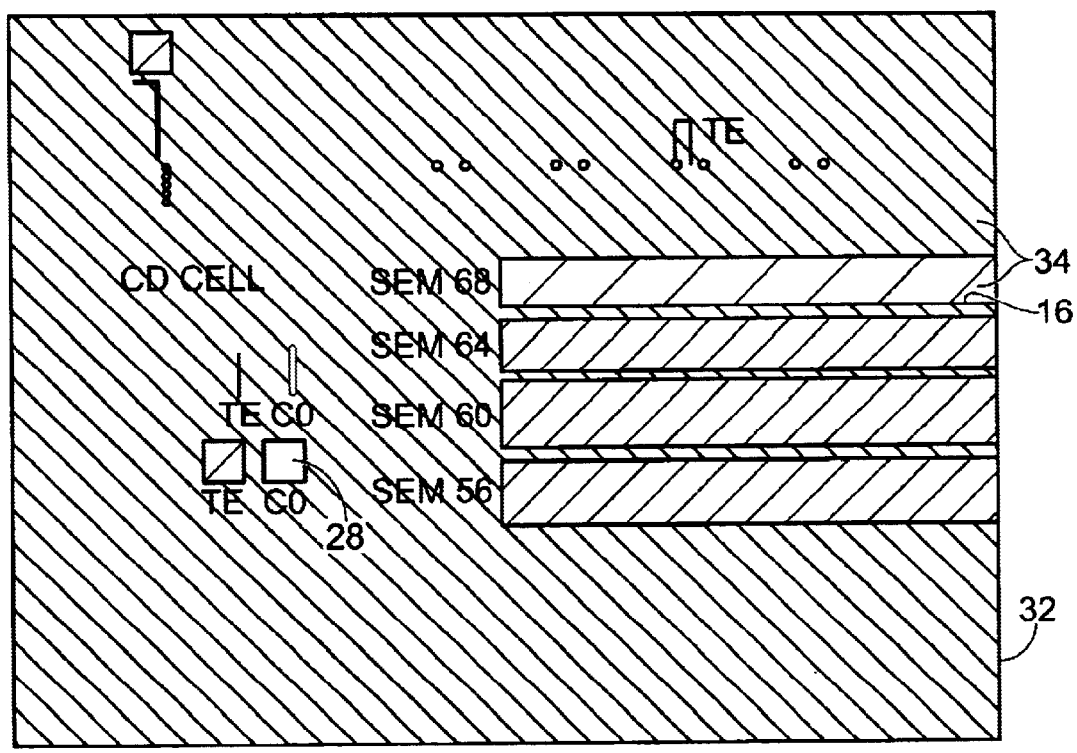

US 6,723,643 B1

METHOD FOR CHEMICAL MECHANICAL POLISHING OF THIN FILMS USING END-POINT INDICATOR STRUCTURES

RELATED APPLICATION

This Application is related to Device and method for reversible resistance change induced by electric pulses in non-crystalline perovskite unipolar programmable memory; Ser. No. 10/072,225, filed Feb. 7, 2002.

FIELD OF THE INVENTION

This invention relates to CMP processes for use in fabrication of integrated circuits generally, and specifically to CMP used to fabricate a non-volatile resistance RAM structure and CMOS processes to make the memory devices, particularly CMR/PCMO devices.

BACKGROUND OF THE INVENTION

Colossal Magnetoresistance (CMR) materials, such as $Pr_{0.7}Ca_{0.3}MnO_3$ (PCMO) for example, have been found to have varying resistance states depending on the polarity and strength of an electric pulse passed through the material. These types of material may be used for novel non-volatile resistance random access memory (RRAM) applications. However, the integration of CMR films into CMOS ICs remains a challenge.

Know techniques for incorporation of CMR materials into CMOS ICs include the use of a damascene structure along with chemical mechanical polishing (CMP), which has been used to pattern CMR films into a CMOS circuit, as shown in FIG. 1. A commercially available slurry, silica plus $NH_4OH$, which is generally used to polish $SiO_2$, however, this slurry is not known to have been used in the CMP of CMR films. As is to be expected, CMP selectivity between CMR films and $SiO_2$ films is poor. That means that CMP of CMR films will not stop on the underlying oxide, such as tetraethylorthosilicate oxide (oxane) TEOS film. This leads to over polishing of CMR films and makes CMR thickness control difficult. Additionally, because of the high PCMO processing temperature, e.g., 500° C. to 650° C., required to form proper PCMO structure for RRAM applications, there is some inter-reaction at the $SiO_2$/PCMO interface, which makes thickness measurement of $SiO_2$ unreliable. This characteristic of CMR CMP has precluded the use of $SiO_2$ thickness measurements to determine the end point of CMP CMR films and also for controlling CMR film thickness.

A PCMO thin film has been grown on both epitaxial $YBa_2Cu_3O_7$ (YBCO) and partial epitaxial Pt substrates via pulsed laser abrasion (PLA) technique, Liu et al., *Electric-pulse-induced reversible resistance change effect in magnetoresistive films,* Applied Physics Letters, 76, 2749, 2000; and Liu et al., U.S. Pat. No. 6,204,139, granted Mar. 20, 2001, for Method of switching the properties of perovskite materials used in thin film resistors. X-Ray diffraction (XRD) polar figures confirm the epitaxial properties of PCMO thin films. Liu et al., *A new concept for non-volatile memory: the electric-pulse induced resistive change effect in Colossal Magnetoresistive thin films,* JPL Publication 01–15; Non-Volatile Memory Technology Symposium 2001; November, 2001, pp 18–24, provides additional research information in the field of CMR-containing integrated circuits.

U.S. Pat. No. 6,204,139 describes the resistance change which occurred when electric pulses are applied at room temperature to PCMO thin films. The PCMO thin films were deposited on both epitaxial $YBa_2Cu_3O_7$ (YBCO) and partial epitaxial Pt substrates by pulsed laser deposition (PLD). The polarity of the electric pulse determines the character of the resistance change, i.e., increase or decrease.

SUMMARY OF THE INVENTION

A method of CMP thin films during fabrication of IC devices includes preparing a substrate, including building IC component structures on the substrate; depositing a bottom electrode on the substrate; depositing a first CMP layer having a first known CMP selectivity on the substrate; patterning the first CMP layer to form a pattern having a lower margin; forming indicator structures on the first CMP layer in the pattern; depositing a second CMP layer having a second known CMP selectivity relative to that of the first CMP layer, including depositing portions of the second CMP layer in the pattern of the first CMP layer; CMP the structure so that the indicator structures are removed and any portion of the first CMP layer and second CMP layer are removed to a level corresponding to the lower margin; and completing the IC structure.

It is an object of the invention to provide an indicator useful in CMP of integrated circuit component layers having poor CMP selectivity.

Another object of the invention is to provide a method for CMP of CMR materials formed on oxide layers or nitride layers.

A further object of the invention is to provide for CMP of CMR materials with a silica and ammonium hydroxide slurry.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIGS. 3–7 depict steps in an end-point-structure-making process.

FIGS. 8–10 are photos of various steps in the method of the invention.

DETAILED DESCRIPTION OF THE PREFERRED EMBODIMENTS

The method of the invention provides a practical method for end point detecting as well as colossal magnetoresistive (CMR) thickness control in chemical mechanical polishing (CMP) CMR-containing IC devices. As previously noted, the problem solved by the method of the invention is that of determining when to cease CMP of an IC component layer when there is little difference in the CMP rates of layered materials.

Figure 1:
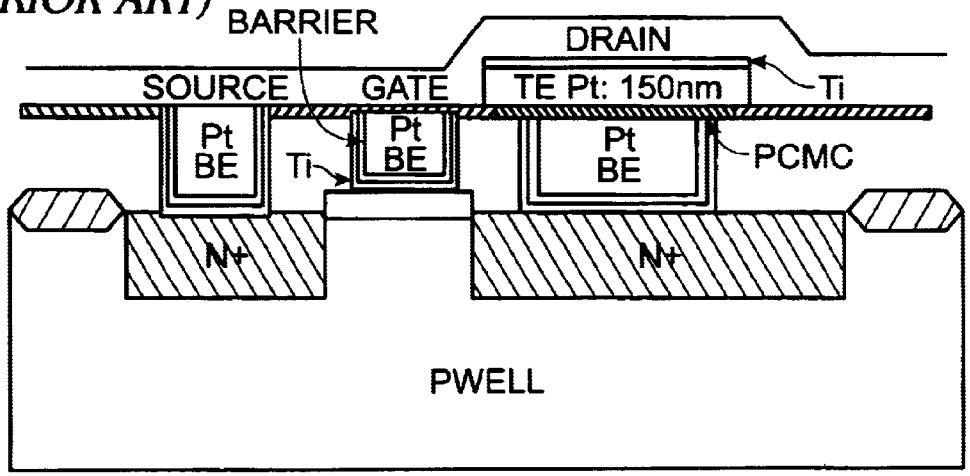
FIG. 1 depicts a prior art RRAM cell having a damascene structure for PCMO deposition.
Figure 2:
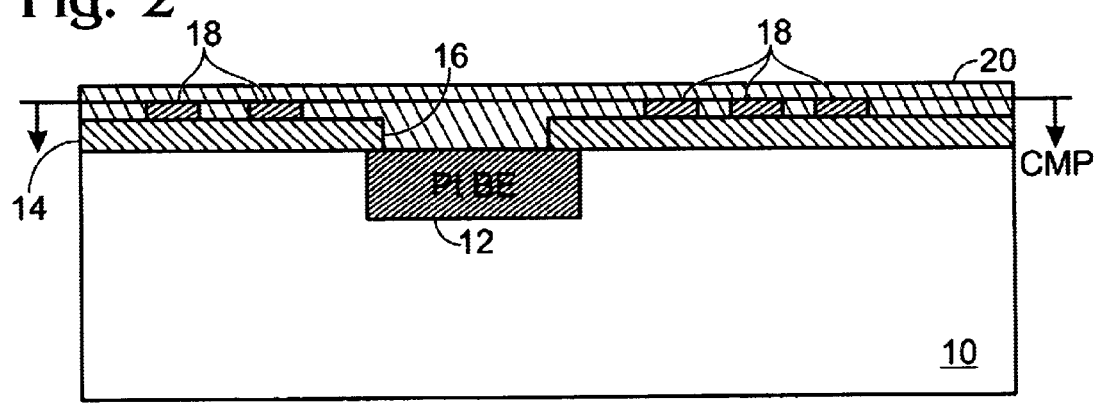
FIG. 2 is a schematic representation of metal patterns which are pre-laid under CMR films for CMP CMR end point detection.

Referring to FIG. 2, an integrated circuit substrate 10 has any number of IC components formed thereon, including a bottom electrode 12, and an oxide or nitride layer 14, referred to herein as a first CMP layer having a known CMP selectivity. A damascene trench 16 is formed in the first CMP layer, exposing a portion of the upper surface of bottom electrode 12. In the method of the invention, special patterned end-point indicator structures 18 are laid down before the deposition of a CMR film 20, which indicator structures may be seen to extend upwardly into the CMR, or other IC film. Indicator structures 18 may also be formed under "dented" portions of the overlying IC film layer. CMR material is transparent in thin layers, therefor, the indicator structures may be seen though the overlying CMR layer. This pattern, however, is gradually polished off during CMP of the CMR film. The end point of CMP is obtained when indicator structure 18 pattern is gone, resulting in a portion of the CMR layer and first CMP layer being removed by CMP, until indicator structures are gone, leaving the CMR layer only in trench 16.

Figure 3:
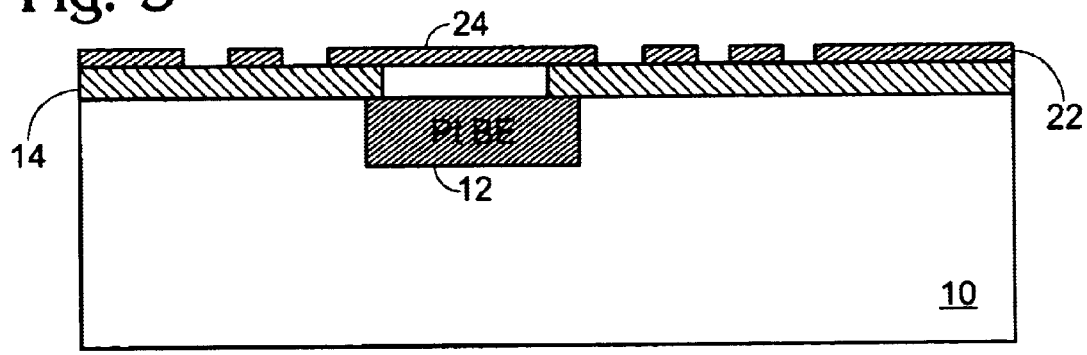
Figure 4:
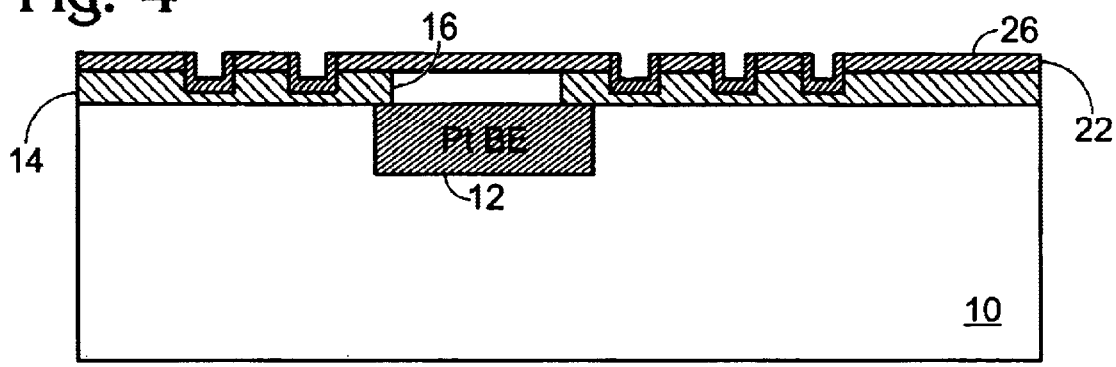

Although the method of the invention is described in connection with a preferred embodiment relating to a specific type of IC component, e.g., PCMO, the method of the invention is not limited to use with the IC component used as an example, and may be applied to an IC fabrication. The method of the invention is a process that constructs the end-point indicator structures on the wafer surface includes the following steps:

Referring now to FIG. 3, substrate 10 includes any number of IC structures, including a bottom electrode 12, e.g., a platinum bottom electrode. An oxide or nitride first CMP layer 14 is formed over the substrate and bottom electrode. Layer 14 is also referred to herein as a first CMP layer. A trench 16 is formed in first CMP layer 14. A photo resist layer 22 is applied to the wafer. The photo resist is pattered with a metal mask 24 which contains an end-point structure pattern. The wafer is placed in a buffered oxide etch (BOE) 50:1 after being developed for one to two minutes. This will provide an etched step of between about 20 nm to 40 nm in depth.

Figure 5:
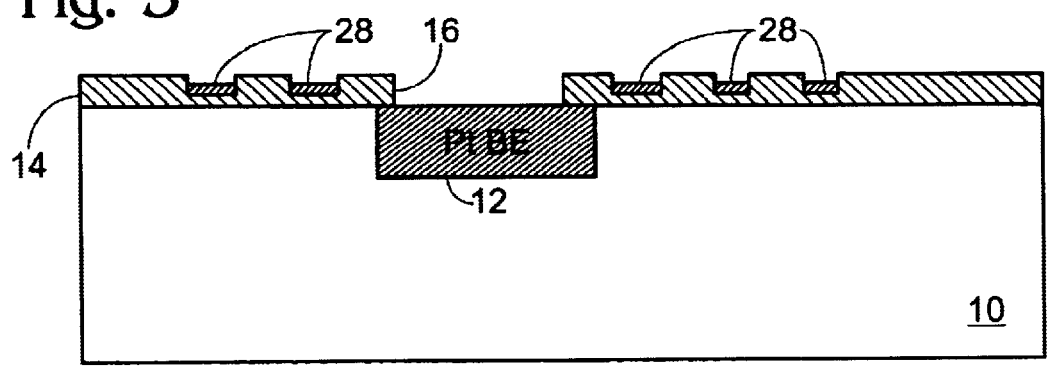

The photoresist is retained in place, a metal indicator layer 26 is deposited, e.g., titanium to a thickness of about 5 nm or aluminum to a thickness of about 10 nm, with PVD being the accepted method for such deposition. E-beam evaporation is one technique which is appropriate for this purpose. The metal-coated wafers are dipped into a photoresist removal solution, e.g., acetone or EKC, resulting in the structure of FIG. 5, having indicator structures 28 formed in trenches in first CMP layer 14.

Figure 6:
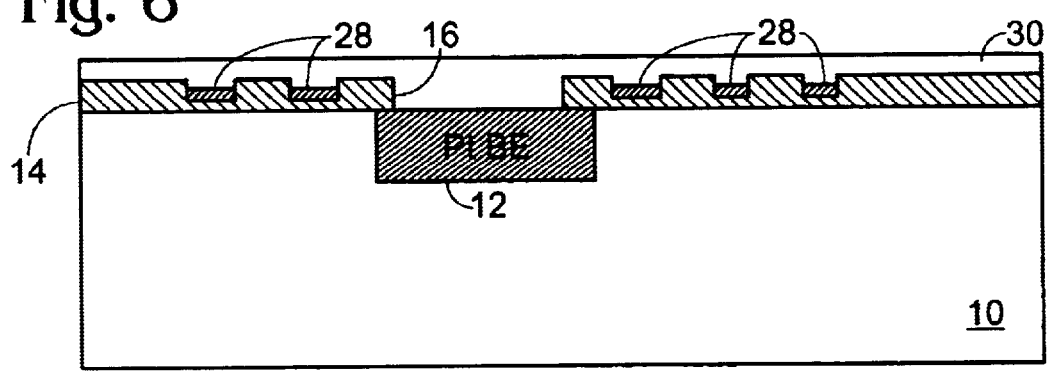

As shown in FIG. 6, a layer of CMR material 30 is deposited in the structure. However, as will be appreciated by one of ordinary skill in the art, layer 30 may be any material which is (1) required to be partially removed or smoothed by CMP; and (2) has a known CMP selectivity relative to the CMP selectivity of layer 14. Layer 30 is also referred to herein as a second CMP layer. As previously noted, layer 14, the first CMP layer, has a first known CMP selectivity, Layer 14 may be silicon dioxide or silicon nitride. Layer 30 is a second CMP layer having a second known CMP selectivity relative to the first known CMP selectivity. In the case of $SiO_2$, PCMO and SiN, $SiO_2$ polishes at a CMP rate faster than PCMO, and PCMO polishes at a CMP rate faster than SiN. Other CMR materials polish at about the same rate as PCMO.

After the first and second CMP layers and the indicators structures are laid down, CMP is performed in a slurry which will work on oxide, nitride and CMR materials. The method of the invention uses a silica+ammonium hydroxide ($NH_4OH$) slurry, which has been found to be effective on CMR materials as well as on $SiO_2$ and SiN. CMP continues until end-point indicator structures 28 are removed, indicating that the CMP is complete and that a desired amount of the CMR has been removed. Referring to FIG. 7, the structure is depicted after CMP, wherein only a portion of first CMP layer 14 remains, with trench 16 being filled with CMR material 30. The indicator structures, the upper portion of CMR layer 30 and a portion of first CMP layer 14 have been removed by CMP, which is performed until the indicator structures are removed.

Figure 9:
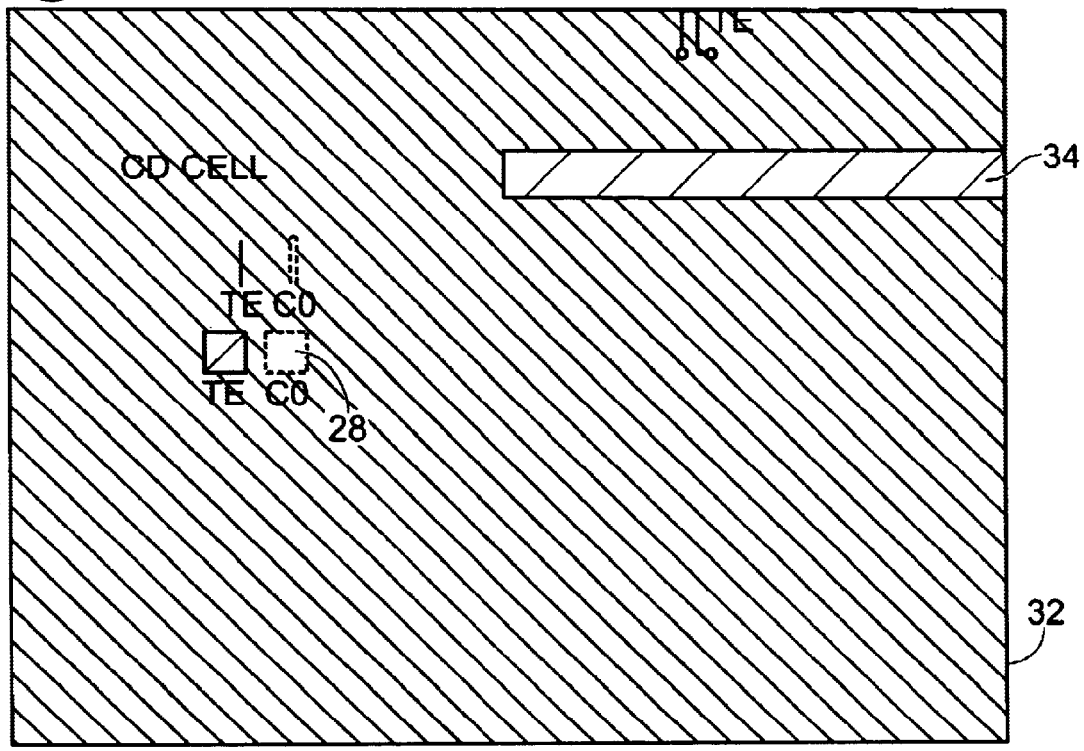
Figure 10:
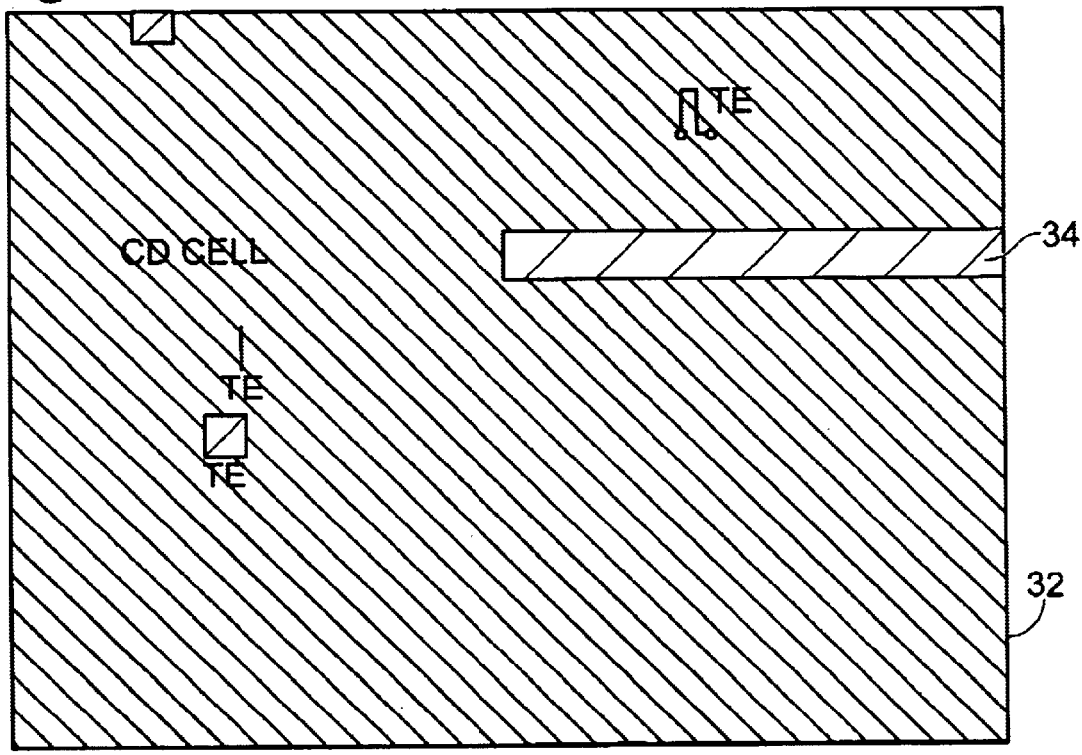

FIG. 8 is a photo of an indicator structure 28, formed on a SiN layer 32, which has a transparent PCMO CMR layer 34 deposited thereon. A trench 16 is also filled with PCMO CMR material. FIG. 9 depicts partial removal of PCMO CMR layer 34 outside of trench 16 and partial removal of indicator structure 28. In FIG. 10, all that remains in PCMO CMR material 34 in trench 16 and SiN layer 32. Careful observation of the demise of indicator structures 28 provides a positive indicator of the extend of the CMP process, and provides an indicator which is used to stop the CMP process before the CMP process removes significant portions of the first CMP layer.

Thus, a method for CMP of CMR thin films has been disclosed. It will be appreciated that further variations and modifications thereof may be made within the scope of the invention as defined in the appended claims.

We claim:

1. A method of CMP thin films during fabrication of IC devices, comprising:

preparing a substrate, including building IC component structures on the substrate;

depositing a bottom electrode on the substrate;

depositing a first CMP layer having a first known CMP selectivity on the substrate;

patterning the first CMP layer to form a pattern having a lower margin thereto;

forming indicator structures on the first CMP layer in the pattern;

depositing a second CMP layer having a second known CMP selectivity relative to that of the first CMP layer, including depositing portions of the second CMP layer in the pattern of the first CMP layer;

CMP the structure so that the indicator structures are removed and any portion of the first CMP layer and second CMP layer are removed to a level corresponding to the lower margin; and completing the IC structure.

2. The method of claim 1 wherein said depositing a first CMP layer includes depositing a layer of material taken from the group of materials consisting of oxides and nitrides.

3. The method of claim 1 wherein said depositing a layer of second CMP material includes depositing a layer of PCMO.

4. The method of claim 1 wherein said forming indicator structures includes depositing a layer of metal take from the group of metals consisting of titanium and aluminum.

5. The method of claim 1 wherein said CMP includes CMP with a slurry formed of silica and ammonium hydroxide.

6. A method of CMP thin films during fabrication of IC devices, comprising:

preparing a substrate, including building IC component structures on the substrate;

depositing a bottom electrode on the substrate;

depositing an first CMP layer having a first known CMP selectivity on the substrate;

patterning the first CMP layer to form a pattern having a lower margin;

forming indicator structures on the first CMP layer in the pattern;

depositing a CMR layer having a second known CMP selectivity relative to that of the oxide layer, including depositing portions of the CMR layer in the pattern of the first CMP layer;

CMP the structure with a slurry of silica and ammonium hydroxide so that the indicator structures are removed and any portion of the first CMP layer and CMR layer are removed to a level corresponding to the lower margin; and completing the IC structure.

7. The method of claim 6 wherein said forming indicator structures includes depositing a layer of metal take from the group of metals consisting of titanium and aluminum.

8. The method of claim 6 wherein said depositing a first CMP layer includes depositing a layer of material taken from the group of materials consisting of oxides and nitrides.

9. The method of claim 6 wherein said depositing a CMR layer includes depositing a layer of PCMO.

10. A method of CMP thin films during fabrication of IC devices, comprising:

preparing a substrate, including building IC component structures on the substrate;

depositing a bottom electrode on the substrate;

depositing an first CMP layer taken from the group of materials consisting of silicon dioxide and silicon nitride having a first known CMP selectivity on the substrate;

patterning the first CMP layer to form a pattern having a lower margin;

forming indicator structures on the first CMP layer in the pattern;

depositing a CMR layer having a second known CMP selectivity relative to that of the oxide layer, including depositing portions of the CMR layer in the pattern of the first CMP layer;

CMP the structure with a slurry of silica and ammonium hydroxide so that the indicator structures are removed and any portion of the first CMP layer and CMR layer are removed to a level corresponding to the lower margin; and completing the IC structure.

11. The method of claim 10 wherein said forming indicator structures includes depositing a layer of metal take from the group of metals consisting of titanium and aluminum.

12. The method of claim 10 wherein said depositing a CMR layer includes depositing a layer of PCMO.

* * * * *